United States Patent
Drewes

(10) Patent No.: US 7,902,580 B2
(45) Date of Patent: *Mar. 8, 2011

(54) ASSEMBLIES COMPRISING MAGNETIC ELEMENTS AND MAGNETIC BARRIER OR SHIELDING

(75) Inventor: Joel A. Drewes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/561,994

(22) Filed: Sep. 17, 2009

(65) Prior Publication Data

US 2010/0019298 A1  Jan. 28, 2010

Related U.S. Application Data

(60) Continuation of application No. 11/755,677, filed on May 30, 2007, now Pat. No. 7,605,417, which is a division of application No. 11/326,643, filed on Jan. 6, 2006, now Pat. No. 7,214,547, which is a division of application No. 10/622,295, filed on Jul. 17, 2003, now Pat. No. 7,001,779, which is a division of application No. 10/121,298, filed on Apr. 11, 2002, now Pat. No. 6,627,932.

(51) Int. Cl.
*H01L 29/82* (2006.01)

(52) U.S. Cl. ................... 257/295; 257/E29.323

(58) Field of Classification Search .............. 257/295, 257/E29.323; 438/3
See application file for complete search history.

(56) References Cited

U.S. PATENT DOCUMENTS

| | | | |
|---|---|---|---|
| 5,266,530 A | 11/1993 | Bagley et al. | |
| 6,235,638 B1 | 5/2001 | Huang et al. | |
| 6,338,899 B1 | 1/2002 | Fukuzawa et al. | |
| 6,358,756 B1 | 3/2002 | Sandhu et al. | |
| 6,417,561 B1 * | 7/2002 | Tuttle ............... | 257/659 |
| 6,521,931 B2 | 2/2003 | Sandhu et al. | |
| 6,564,445 B1 | 5/2003 | Hashimoto et al. | |
| 6,577,529 B1 | 6/2003 | Sharma et al. | |
| 6,627,932 B1 | 9/2003 | Drewes | |
| 6,797,628 B2 | 9/2004 | Li et al. | |
| 6,833,982 B2 | 12/2004 | Jayasekara | |
| 6,906,396 B2 | 6/2005 | Tuttle et al. | |
| 2003/0068897 A1 | 4/2003 | Yates | |
| 2003/0164698 A1 | 9/2003 | Paulson et al. | |

OTHER PUBLICATIONS

"What's μ-metal?"; http://digilander.iol.it/paeng/what_mu?metal.htm;2 pages; printed Feb. 26, 2002.
Science Net; Physics & Astronomy; "What's mu metal?"; 1 page; http://www.sciencenet.org.uk/database/Physics/9812/p01213d.html.

* cited by examiner

*Primary Examiner* — Matthew S Smith
*Assistant Examiner* — Daniel Shook
(74) *Attorney, Agent, or Firm* — Wells St. John P.S.

(57) ABSTRACT

The invention includes a method of forming a semiconductor construction, such as an MRAM construction. A block is formed over a semiconductor substrate. First and second layers are formed over the block, and over a region of the substrate proximate the block. The first and second layers are removed from over the block while leaving portions of the first and second layers over the region proximate the block. At least some of the first layer is removed from under the second layer to form a channel over the region proximate the block. A material, such as a soft magnetic material, is provided within the channel. The invention also includes semiconductor constructions.

16 Claims, 9 Drawing Sheets

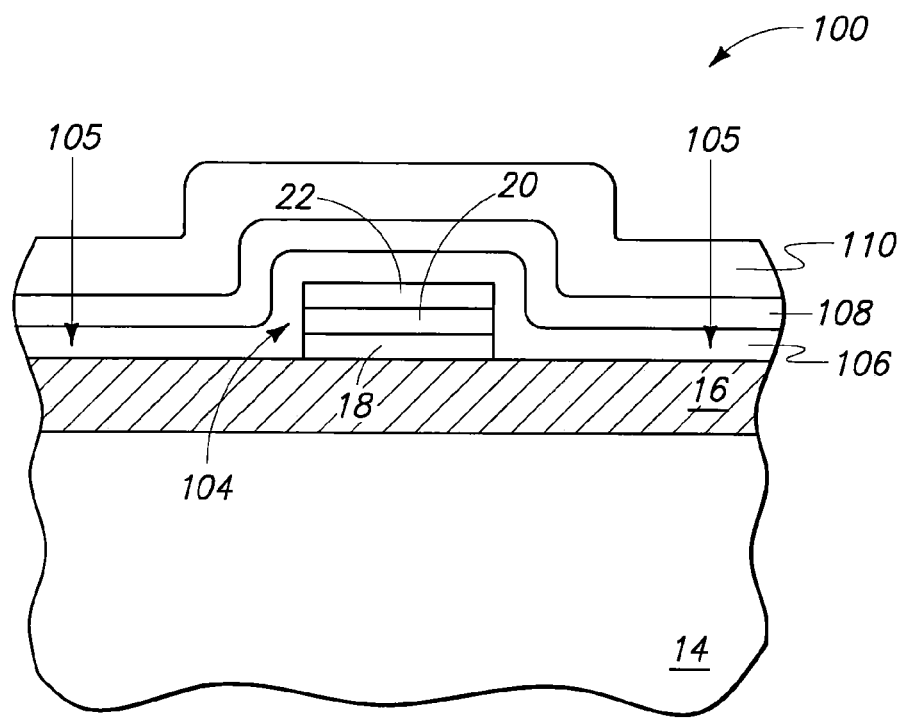
_FIG 5_
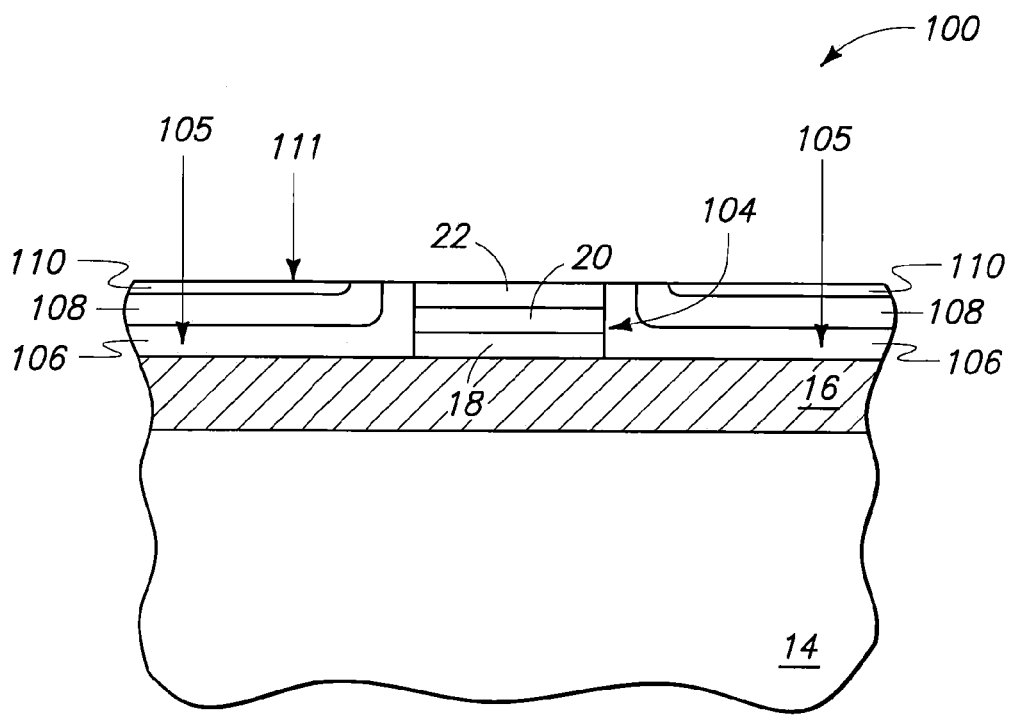
_FIG 6_

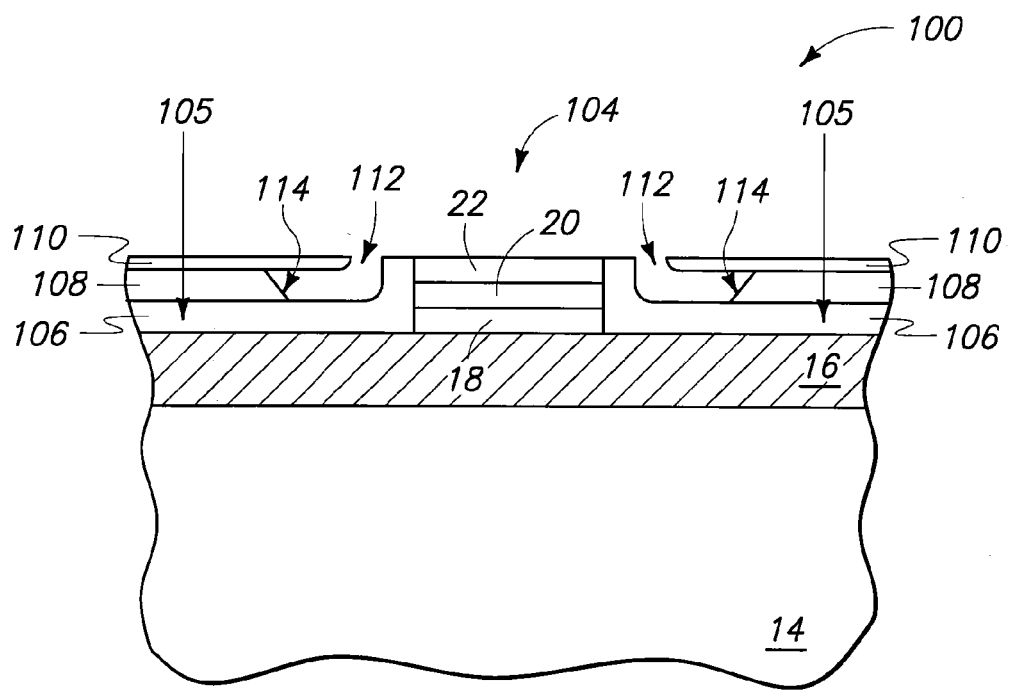
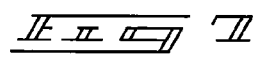
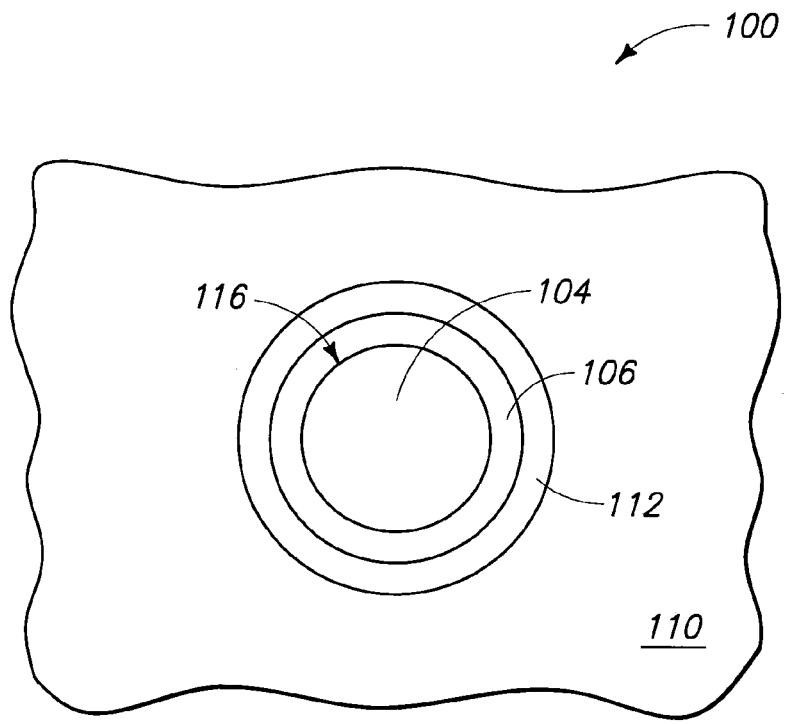
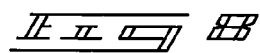

ASSEMBLIES COMPRISING MAGNETIC ELEMENTS AND MAGNETIC BARRIER OR SHIELDING

RELATED PATENT DATA

This patent resulted from a continuation application of U.S. patent application Ser. No. 11/755,677, which was filed May 30, 2007, which issued as U.S. Pat. No. 7,605,417, and which is hereby incorporated herein by reference; which resulted from a divisional application of U.S. patent application Ser. No. 11/326,643, which was filed Jan. 6, 2006, now U.S. Pat. No. 7,214,547, and which is hereby incorporated herein by reference; which resulted from a divisional of U.S. patent application Ser. No. 10/622,295, filed Jul. 17, 2003, now U.S. Pat. No. 7,001,779, which is hereby incorporated by reference; and which resulted from a divisional of U.S. patent application Ser. No. 10/121,298, filed Apr. 11, 2002, now U.S. Pat. No. 6,627,932, which is hereby incorporated by reference.

TECHNICAL FIELD

The invention pertains to semiconductor constructions and methods of forming semiconductor constructions. In particular applications, the invention pertains to magnetoresistive memory devices, and methods of forming such devices.

BACKGROUND OF THE INVENTION

Magnetic random access memory (MRAM) devices are showing increasing promise for utilization as memory storage devices of the future. MRAM is a type of digital memory in which digital bits of information comprise alternative states of magnetization of magnetic materials in memory cells. The magnetic materials can be thin ferromagnetic films. Information can be stored and retrieved from the memory devices by inductive sensing to determine a magnetization state of the devices, or by magnetoresistive sensing of the magnetization states of the devices. It is noted that the term "magnetoresistive device" can be utilized to characterize a memory device and not the access device, and accordingly a magnetoresistive device can be accessed by, for example, either inductive sensing or magnetoresistive sensing methodologies.

A significant amount of research is currently being invested in magnetic digital memories, such as, for example, MRAM's, because such memories are seen to have significant potential advantages relative to the dynamic random access memory (DRAM) components and static random access memory (SRAM) components that are presently in widespread use. For instance, a problem with DRAM is that it relies on electric charge storage within capacitors. Such capacitors leak electric charge, and must be refreshed at approximately 64-128 millisecond intervals. The constant refreshing of DRAM devices can drain energy from batteries utilized to power the devices, and can lead to problems with lost data since information stored in the DRAM devices is lost when power to the devices is shut down.

SRAM devices can avoid some of the problems associated with DRAM devices, in that SRAM devices do not require constant refreshing. Further, SRAM devices are typically faster than DRAM devices. However, SRAM devices take up more semiconductor real estate than do DRAM devices. As continuing efforts are made to increase the density of memory devices, semiconductor real estate becomes increasingly valuable. Accordingly, SRAM technologies are difficult to incorporate as standard memory devices in memory arrays.

MRAM devices have the potential to alleviate the problems associated with DRAM devices and SRAM devices. Specifically, MRAM devices do not require constant refreshing, but instead store data in stable magnetic states. Further, the data stored in MRAM devices will remain within the devices even if power to the devices is shutdown or lost. Additionally, MRAM devices can potentially be formed to utilize less than or equal to the amount of semiconductor real estate associated with DRAM devices, and can accordingly potentially be more economical to incorporate into large memory arrays than are SRAM devices.

Although MRAM devices have potential to be utilized as digital memory devices, they are currently not widely utilized. Several problems associated with MRAM technologies remain to be addressed. It would be desirable to develop improved methods for operation of MRAM devices.

FIG. 1 illustrates a fragment of an exemplary prior art construction 10 comprising an MRAM device 12. More specifically, construction 10 comprises a substrate 14 having a conductive line 16 formed thereover, and device 12 is formed over the conductive line.

Substrate 14 can comprise an insulative material, such as, for example, borophosphosilicate glass (BPSG), silicon dioxide and/or silicon nitride. Such insulative material can be formed over a semiconductive material, such as, for example, monocrystalline silicon. Further, various integrated circuit devices can be supported by the semiconductive material. In the construction of FIG. 1, substrate 14 is illustrated generically as a homogeneous mass, but it is to be understood from the discussion above that substrate 14 can comprise numerous materials and layers. In the event that substrate 14 comprises a semiconductive material, such semiconductive material can be, for example, monocrystalline silicon lightly-doped with a background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Conductive line 16 can comprise, for example, various metals and metal alloys, such as, for example, copper and/or aluminum.

The MRAM device 12 formed over line 16 comprises three primary layers, 18, 20 and 22. Layers 18 and 22 comprise soft magnetic materials, such as, for example, materials comprising one or more of nickel, iron, cobalt, iridium, manganese, platinum and ruthenium. Layer 20 comprises a non-magnetic material. The non-magnetic material can be an electrically conductive material (such as copper) in applications in which the MRAM is to be a giant magnetoresistive (GMR) device, or can be an electrically insulative material (such as, for example, aluminum oxide ($Al_2O_3$) or silicon dioxide), in applications in which the MRAM device is to be a tunnel magnetoresistive (TMR) device.

Layers 18 and 22 have magnetic moments associated therewith. The magnetic moment in layer 18 is illustrated by arrows 19, and the magnetic moment in layer 22 is illustrated by arrows 21. In the shown construction, the magnetic moment in layer 22 is anti-parallel to the magnetic moment in layer 18. Such is one of two stable orientations for the magnetic moment of layer 22 relative to that of 18, with the other stable orientation being a parallel orientation of the magnetic moment in layer 22 relative to the moment in layer 18. One of layers 18 and 22 can have a pinned orientation of the magnetic moment therein, and such can be accomplished by providing a hard magnetic layer, or in other words a permanent magnet (not shown) adjacent the layer. The layer having the pinned magnetic moment can be referred to as a reference layer.

In operation, MRAM device 12 can store information as a relative orientation of the magnetic moment in layer 22 to that in layer 18. Specifically, either the anti-parallel or parallel orientation of the magnetic moments of layers 18 and 22 can be designated as a 0, and the other of the anti-parallel and parallel orientations can be designated as a 1. Accordingly, a data bit can be stored within device 12 as the relative orientation of magnetic moments in layers 18 and 22.

A conductive line 24 is shown over layer 22, and such conductive line extends into and out of the plane of the page. Conductive line 24 can comprise, for example, one or more metals and/or metal alloys, including, for example, copper and/or aluminum.

An insulative material 26 extends over conductive line 16, and along the sides of bit 12 and conductive line 24. Insulative material 26 can comprise, for example, BPSG.

The construction 10 is an exemplary MRAM construction, and it is to be understood that various modifications can be made to the construction 10 for various applications. For instance, one or more electrically insulative layers (not shown) can be provided between device 12 and one or both of conductive lines 16 and 24. Also, one or more magnetic layers (not shown) can be stacked within device 12 in addition to the shown layers 18 and 22.

In operation, data is written to MRAM device 12 by passing current along the conductive lines 16 and 24 to change the relative magnetic orientation of layers 18 and 22 (i.e., to flip the relative orientation from parallel to anti-parallel, or vice versa). In theory, the relative orientation of layers 18 and 22 can be flipped by passing sufficient current along only one of lines 16 and 24, but in practice it is generally found to be advantageous to utilize both of lines 16 and 24 in writing information to device 12. Specifically, some current is initially passed along one of the lines 16 and 24 to induce a magnetic field in device 12 which starts to flip the relative magnetic orientation of layers 18 and 22, and then current is passed along the other of layers 16 and 24 to complete the flip of the relative magnetic orientation within device 12.

The operation of reading information from device 12 can utilize either inductive sensing or magnetoresistive sensing to detect the relative magnetic orientation of layers 18 and 22 within the device. The reading can utilize one or both of lines 16 and 24, and/or can utilize a separate conductive line (not shown).

It is advantageous to have lines 16 and 24 be orthogonal to one another at the location of device 12 to maximize the complementary effect of utilizing both of conductive lines 16 and 24. A device which utilizes a pair of independently controlled conductive lines for writing to and/or reading from an MRAM device is typically referred to as a half-select MRAM construction.

As discussed above, a single MRAM device can store a single bit of information. Accordingly, in applications in which it is desired to process multiple bits of information it is generally desired to utilize a plurality of MRAM devices, with each of the devices independently storing bits of information. The devices will typically be arranged in an array, and an exemplary array 50 of MRAM devices is illustrated in FIG. 2. The array comprises individual MRAM devices which are shown schematically as 52, 54, 56, 58, 60, 62, 64, 66, 68, 70, 72 and 74. Exemplary magnetic poles associated with layers of the MRAM devices (such as the poles associated with layers 18 or 22 of FIG. 1) are illustrated with a "+" and "−" to indicate directional orientations of the poles.

A problem which can occur during operation of the array 50 of MRAM devices is that cross-talk can occur between adjacent devices such that a magnetic field of one device influences the magnetic fields of one or more neighboring devices. The cross-talk can disrupt reading and writing operations to individual MRAM devices, and, in particularly problematic instances, can change a value of a stored bit within an MRAM device. Accordingly, it is desired to alleviate, and preferably prevent, cross-talk between neighboring MRAM devices of a memory array.

SUMMARY OF THE INVENTION

In one aspect, the invention encompasses a method of forming a semiconductor construction. A block is formed over a semiconductor substrate. First and second layers are formed over the block, and over a region of the substrate proximate the block. The first and second layers are removed from over the block while leaving portions of the first and second layers over the region proximate the block. The first layer is etched to remove at least some of the first layer from under the second layer and thereby form a channel over the region proximate the block. A material, such as a soft magnetic material, is provided within the channel.

In one aspect, the invention encompasses a method of forming a magnetoresistive memory device. A memory bit is formed. The bit comprises a stack which includes a first magnetic mass, a second magnetic mass, and a non-magnetic mass between the first and second magnetic masses. First, second and third layers are formed over the memory bit, and over a region proximate the memory bit. The second and third layers are removed from over memory bit, while leaving portions of the second and third layers over the region proximate the memory bit. The second layer is etched with an etch selected for the second layer relative to the third layer to remove at least some of the second layer from under the third layer, and thereby form a channel over the region proximate the memory bit. A first material is formed within the channel to only partially fill the channel. A second material is formed within the partially-filled channel, with the second material being a magnetic material.

In further aspects, the invention includes semiconductor constructions and magnetoresistive memory constructions.

BRIEF DESCRIPTION OF THE DRAWINGS

Preferred embodiments of the invention are described below with reference to the following accompanying drawings.

FIG. 5 is a view of the FIG. 3 fragment shown at a processing stage subsequent to that of FIG. 4.

FIG. 6 is a view of the FIG. 3 fragment shown at a processing stage subsequent to that of FIG. 5.

FIG. 7 is a view of the FIG. 3 fragment shown at a processing stage subsequent to that of FIG. 6.

FIG. 8 is a top view of the construction of FIG. 7.

DETAILED DESCRIPTION OF THE PREFERRED EMBODIMENTS

A first aspect of the present invention is described with reference to FIGS. 3-12. In referring to FIGS. 3-12, similar numbering will be used as was utilized above in describing the prior art of FIG. 1, where appropriate.

Figure 3:
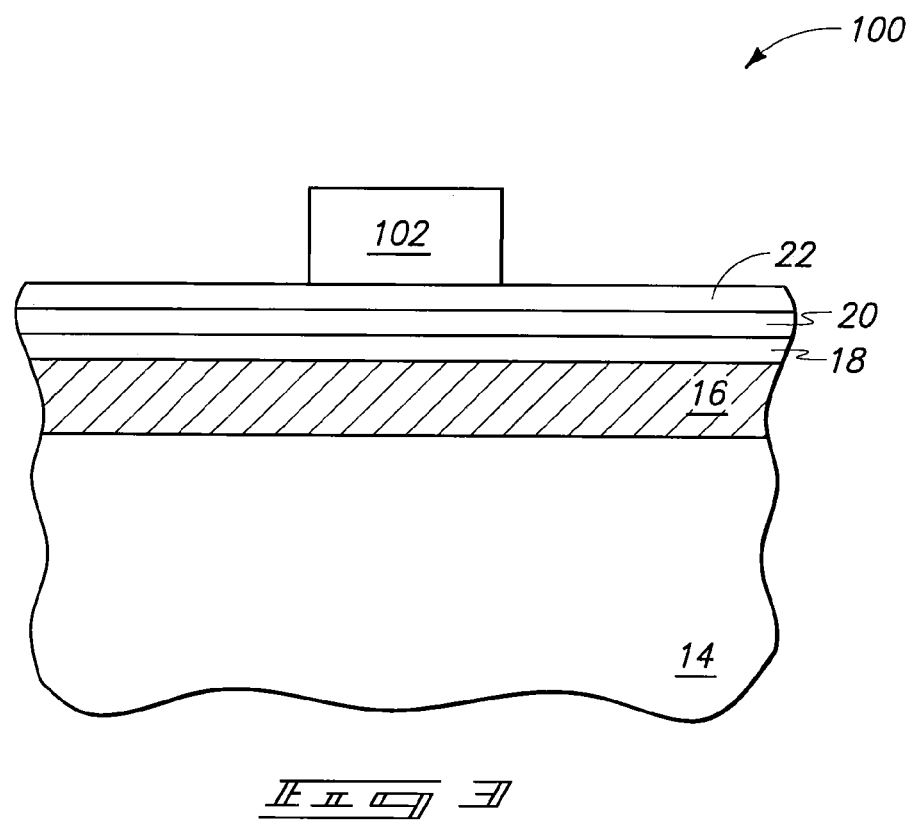
FIG. 3 is a diagrammatic, cross-sectional view of a fragment of a semiconductor construction at a preliminary processing stage of a method in accordance with an aspect of the present invention.

Referring initially to FIG. 3, a semiconductor construction 100 is illustrated in fragmentary view. Construction 100 comprises a substrate 14 and a conductive line 16. Additionally, construction 100 comprises layers 18, 20 and 22 formed over conductive line 16. Substrate 14, and lines 16, 18, 20 and 22 can comprise the materials described above with reference to prior art FIG. 1.

A patterned masking material 102 is formed over layer 22. Masking material 102 can comprise, for example, photoresist, and can be formed into the shown pattern utilizing photolithographic processing.

Figure 4:
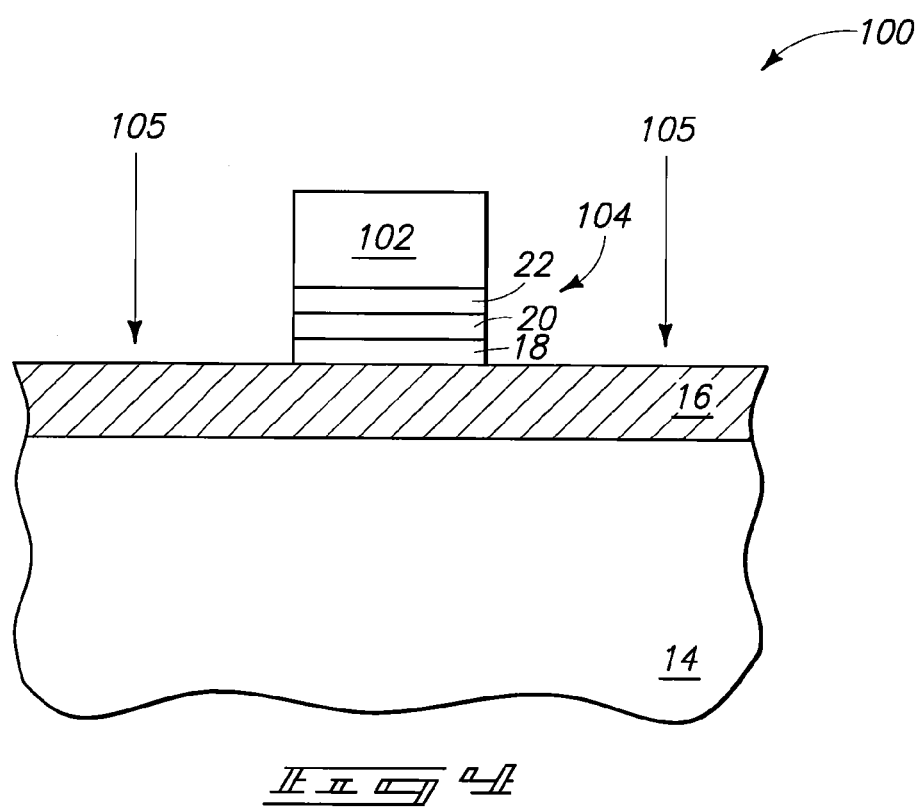
FIG. 4 is a view of the FIG. 3 fragment shown at a processing stage subsequent to that of FIG. 3.
Figure 9:
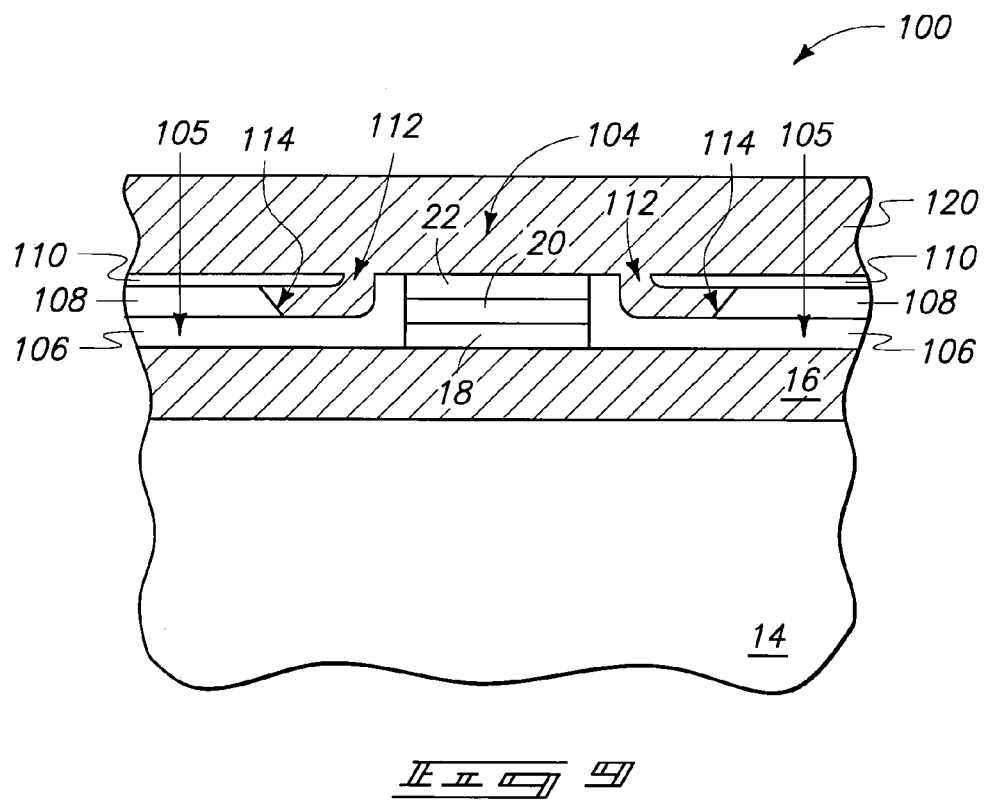
FIG. 9 is a view of the FIG. 3 fragment shown at a processing stage subsequent to that of FIG. 7.

Referring to FIG. 4, a pattern is transferred from masking material 102 to layers 18, 20 and 22 utilizing one or more suitable etches. Such forms the layers 18, 20 and 22 into a block 104. Block 104 is over a first portion of a substrate (with the substrate comprising masses 14 and 16), and regions 105 are defined proximate the first portion of such substrate.

Figure 1:
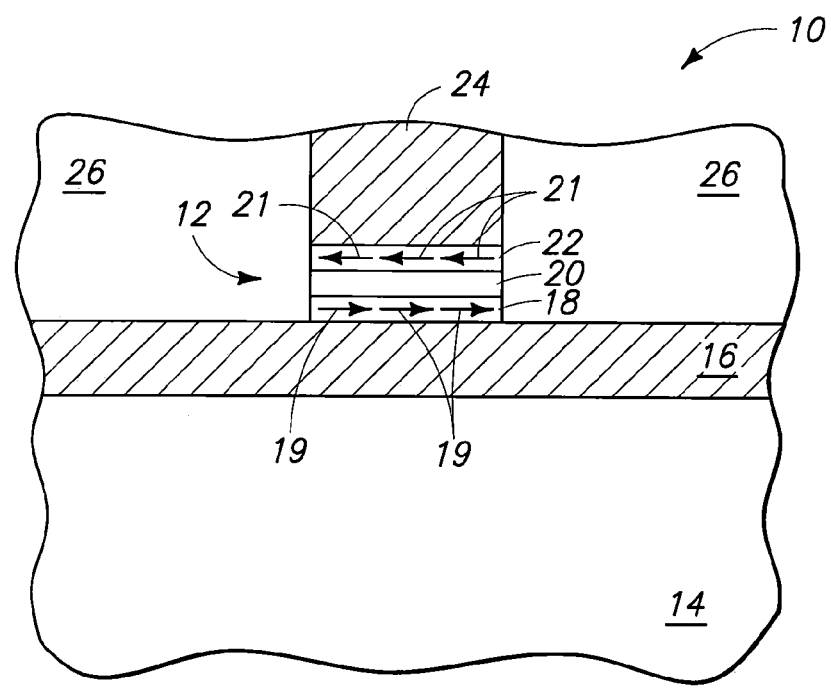
FIG. 1 is a diagrammatic, cross-sectional view of a fragment illustrating a prior art MRAM construction.
Figure 2:
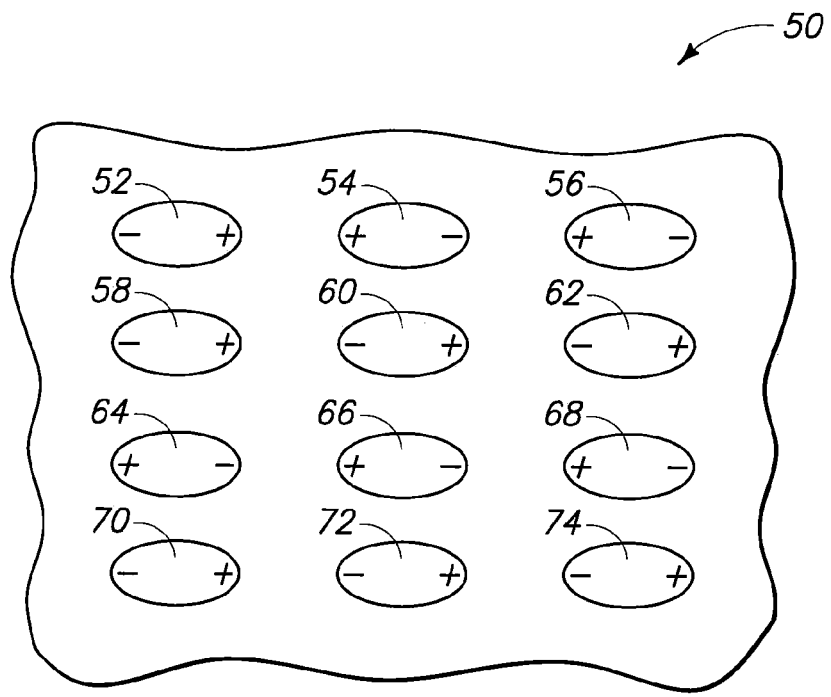
FIG. 2 is a diagrammatic illustration of a prior art memory array comprising MRAM devices.

Block 104 can be referred to herein as a mass 104, and can ultimately correspond to a memory bit, such as the memory bit 12 of FIG. 1. To the extent that block 104 comprises a memory bit, it can be considered to comprise a first magnetic mass (or layer) 18, a second magnetic mass (or layer) 22, and a non-magnetic mass (or layer) 20 between the first and second magnetic masses.

Referring to FIG. 5, patterned masking layer 102 (FIG. 4) is removed, and layers 106, 108 and 110 are formed over block 104 and over the regions 105 proximate block 104. Layers 106, 108 and 110 can be referred to as first, second and third layers respectively. Although three layers are shown formed over block 104 in FIG. 5, it is to be understood that the invention can encompass other applications in which less than three layers or more than three layers are formed over block 104. Each of layers 106, 108 and 110 can have about the same thickness as one another, or the layers can have varying thicknesses. In particular applications of the invention, layers 106, 108 and 110 can have respective thicknesses of from about 100 Å to about 1000 Å.

Layer 108 preferably comprises a material which can be selectively removed relative to layers 106 and 110. For purposes of interpreting this disclosure and the claims that follow, a first material is considered to be "selectively etched" relative to a second material under particular etching conditions if removal of the first material is faster than removal of the second material. Under particular selective etching conditions there may be essentially no removal of the second material, and in other selective etching conditions there can be significant removal of the second material. In exemplary selective etching conditions a first material is removed at a rate that is at least three times faster than a rate of removal of a second material.

In particular applications, layer 108 can comprise silicon dioxide, and layers 106 and 110 can comprise materials to which silicon dioxide can be selectively etched, such as, for example, silicon nitride. In particular applications, layers 106 and 110 will be identical in composition relative to one another, and in such applications layers 106 and 110 can both comprise, consist essentially of, or consist of silicon nitride, while layer 108 comprises, consist essentially of, or consists of silicon dioxide. In alternative applications, layer 108 can comprise silicon nitride, and layers 106 and 110 can comprise materials to which silicon nitride can be selectively etched, such as, for example, silicon carbide.

In further applications, layers 106 and 110 can comprise silicon carbide, and layer 108 can comprise a material other than silicon carbide which can be selectively etched relative to silicon carbide. Suitable materials can include, for example, silicon dioxide and/or silicon nitride.

In other applications, layers 106 and 110 can consist essentially of one or both of silicon and carbon, and layer 108 can consist essentially of silicon and one or both of nitrogen and oxygen. In yet other applications, layers 106 and 110 can consist essentially of silicon and one or both of nitrogen and oxygen, and layer 108 can comprise, consist essentially of, or consist of carbon.

In applications in which layer 108 consists essentially of silicon and oxygen, and layers 106 and 110 consist essentially of one or both of silicon and carbon, the layer 108 can be selectively removed relative to layers 106 and 110 utilizing an etch which includes one or both of ammonium fluoride and hydrofluoric acid.

In applications in which layer 108 comprises carbon (such as, for example, elemental carbon), and first and third layers consist essentially of silicon and one or both of nitrogen and oxygen, layer 108 can be selectively removed relative to layers 106 and 110 with an etch utilizing a $O_2$ plasma.

Referring to FIG. 6, layers 106, 108 and 110 are removed from over block 104, and left over regions 105. A suitable method for removing layers 106, 108 and 110 from over block 104 is chemical-mechanical polishing, which forms the shown planarized upper surface 111 extending across block 104, as well as across layers 106, 108 and 110.

Referring to FIG. 7, construction 100 is exposed to an etch which selectively removes layer 108 relative to layers 106 and 110, and which thus forms a channel region 112 over the region 105 proximate block 104. Channel region 112 has a bottom periphery 114.

FIG. 8 illustrates a top view of FIG. 7, and shows block 104 having a lateral periphery 116, and further shows the channel region 112 entirely surrounding such lateral periphery. In the shown application of the invention block 104 has a circular outer periphery, but it is to be understood that the block can have other shapes, including, for example, rectangular or oval shapes.

Referring to FIG. 9, fragment 100 is again shown in cross-sectional view, as was utilized in FIGS. 3-7, and is shown in a processing stage subsequent to that of FIG. 7. A material 120 is formed over block 104 and within channel region 112. Material 120 can comprise, for example, a magnetic material, and preferably comprises soft, or disordered magnetic properties. Material 120 can thus function as a barrier around magnetic materials 22 and 18 to prevent magnetic interaction between layers associated with adjacent memory bits. In other words, material 120 can function as a shield to block transfer of magnetic energy therethrough, without itself becoming magnetically polarized.

Suitable materials for layer 120 are magnetic materials comprising one or more of nickel, iron and copper, with exemplary materials consisting of essentially of nickel and iron, or consisting essentially of nickel and copper. A particularly suitable material can be a mu-metal (i.e, μ-metal), with mu-metals being understood to be very magnetically soft, and accordingly to provide excellent magnetic shielding.

Figure 10:
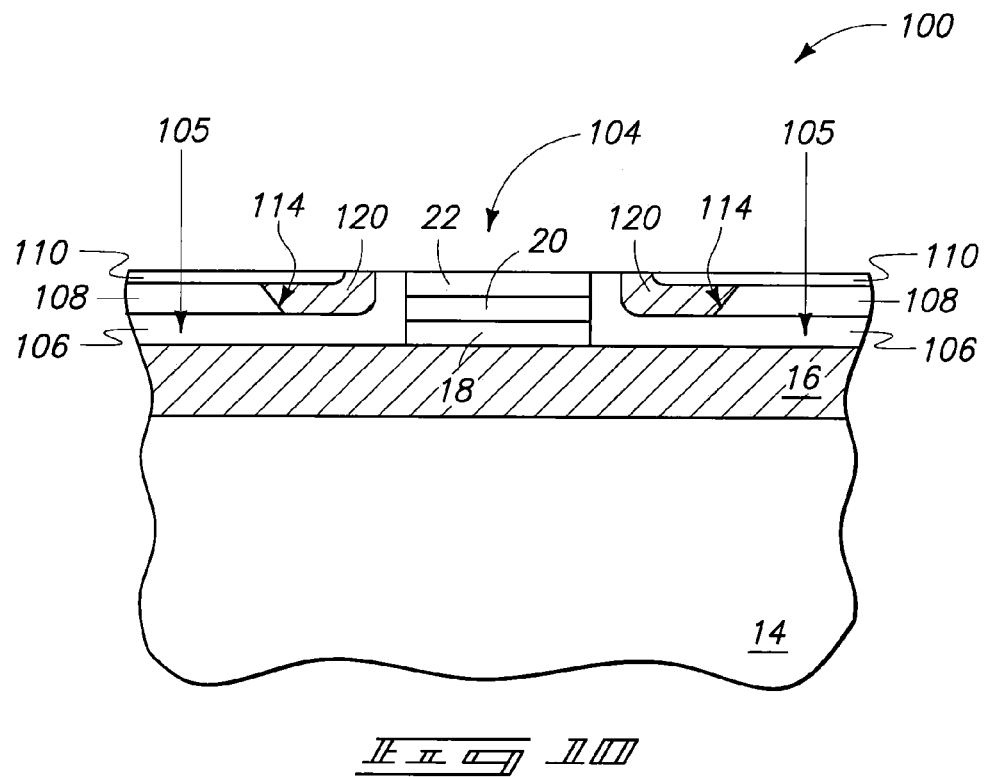
FIG. 10 is a view of the FIG. 3 fragment shown at a processing stage subsequent to that of FIG. 9.
Figure 11:
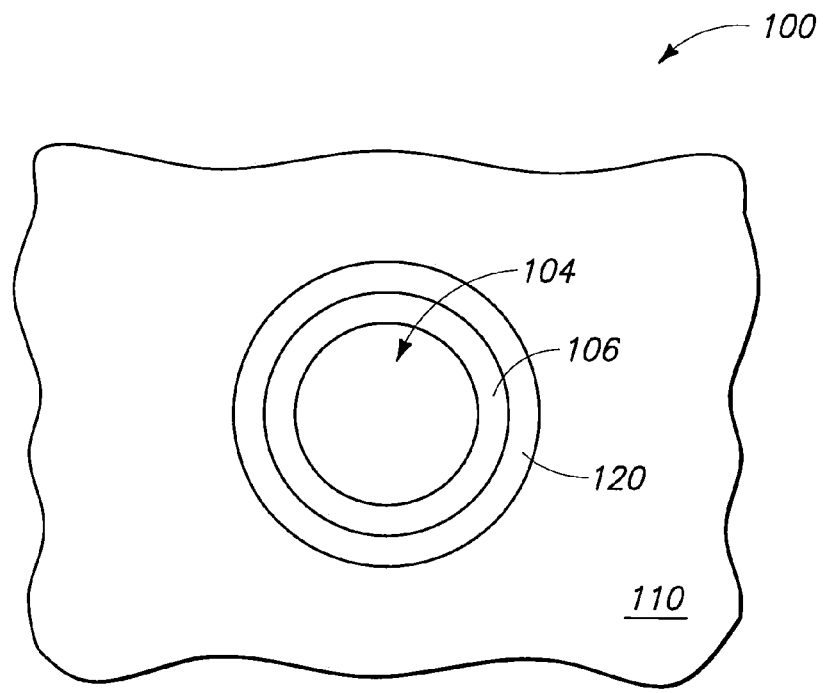
FIG. 11 is a top view of the FIG. 10 construction.

Referring to FIG. 10, material 120 is removed from over block 104. Such removal can comprise, for example, chemical-mechanical polishing. A top view of the FIG. 10 construction is shown in FIG. 11, wherein material 120 is shown extending entirely around block 104. In applications in which material 120 comprises a magnetic barrier material, such forms a magnetic shield entirely surrounding a lateral periphery of an MRAM bit defined by block 104.

Figure 12:
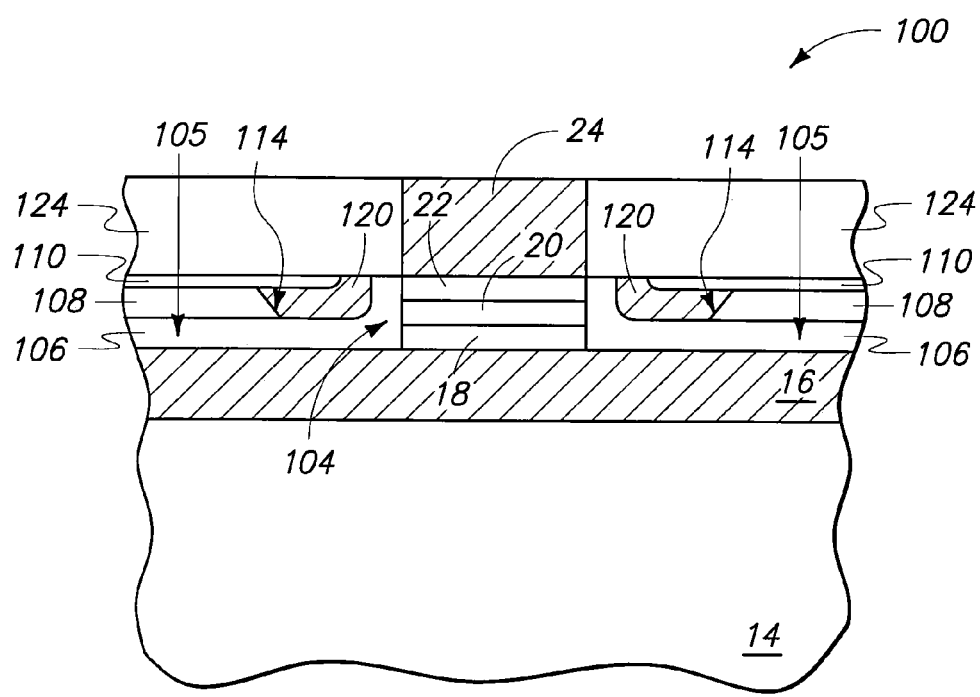
FIG. 12 is a view of the FIG. 3 fragment shown at a processing stage subsequent to that of FIG. 10.

Referring to FIG. 12, a conductive line 24 is formed over block 104, and an insulative material 124 is formed adjacent line 24. The construction of FIG. 12 can be considered to comprise a memory bit (defined by block 104) extending between a first conductive line 16 and a second conductive line 24. The first and second conductive lines can be ultimately utilized to generate a magnetic field within the memory bit during writing of information to the memory bit and/or reading of information from the memory bit. Material 120 forms a magnetic shield which entirely surrounds the memory bit during operation of the memory bit to prevent cross-talk between the memory bit and adjacent memory bits of an MRAM array.

Figure 13:
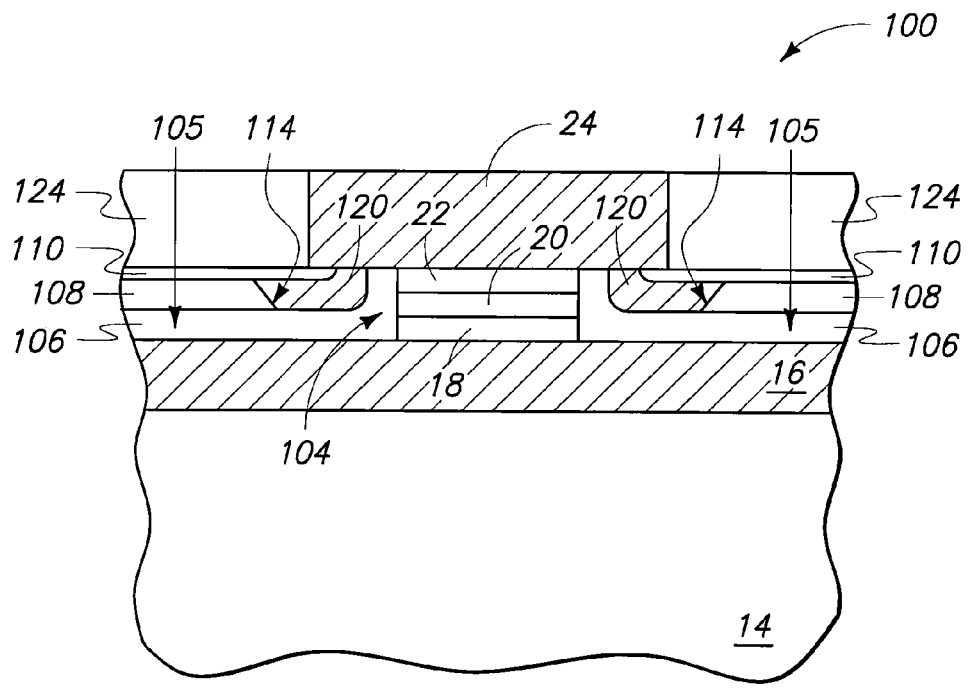
FIG. 13 is a view of the FIG. 3 fragment shown at a processing stage subsequent to that of FIG. 10, in an alternative aspect to that of FIG. 12.

FIG. 13 illustrates a construction similar to that of FIG. 12, with a difference that conductive line 24 extends across material 120 to electrically connect with material 120. In applications in which layers 106, 108 and 110 comprise electrically insulative materials, an electrically conductive material 120 is prevented from electrically interacting with other materials associated with construction 100. Accordingly, conductive material 24 can electrically contact material 120 without being shorted to other electrical devices associated with construction 100. An advantage of having conductive line 24 electrically contact material 120 is that such can allow a relatively wide footprint for material of line 24, which can provide tolerance in the event that various mask misalignments may occur during formation of one or both of block 104 and line 24.

Figure 14:
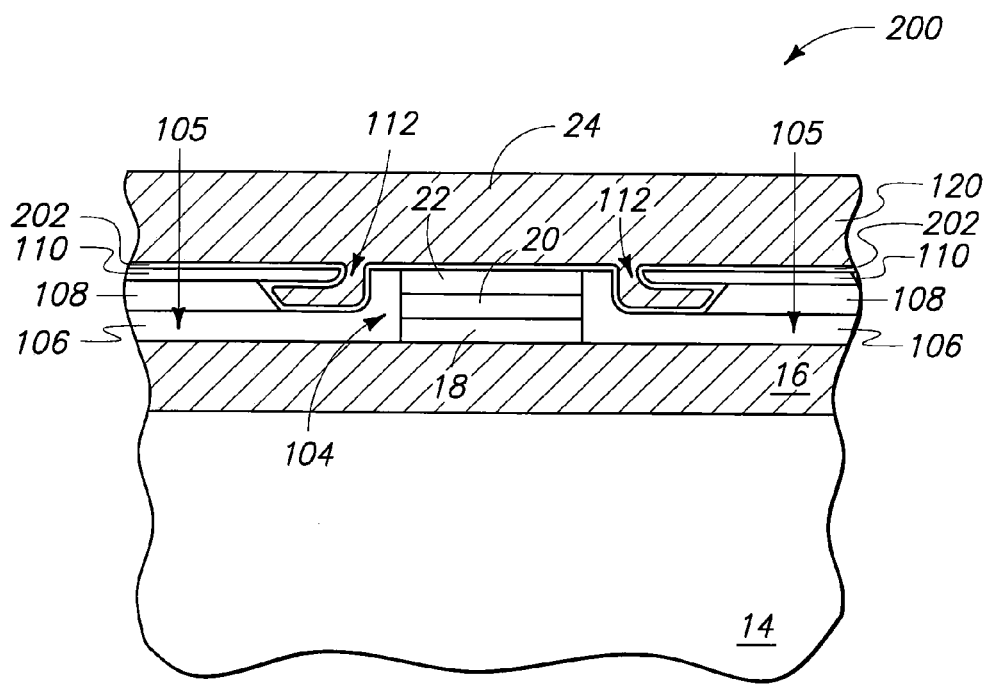
FIG. 14 is a view of the FIG. 3 fragment shown at a processing stage subsequent to that of FIG. 7, in an alternative aspect of the invention relative to that shown in FIG. 9.
Figure 15:
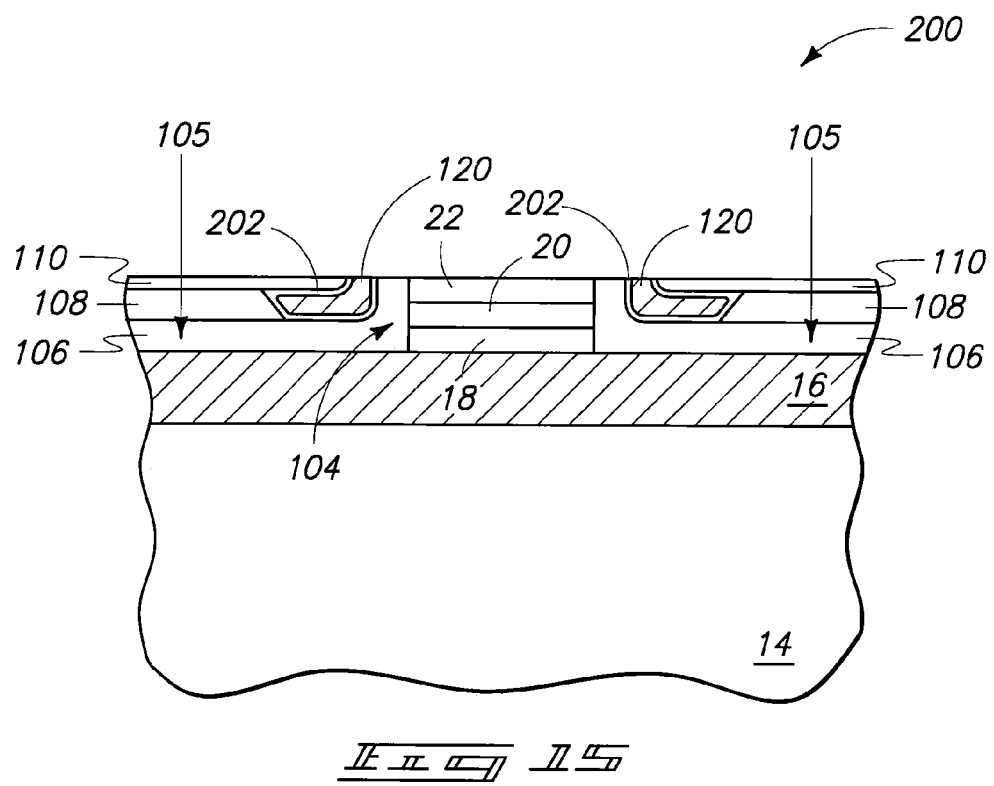
FIG. 15 is a view of the FIG. 14 fragment shown at a processing stage subsequent to that of FIG. 14.

FIGS. 14 and 15 illustrate another aspect of the invention. Referring initially to FIG. 14, a construction 200 is illustrated at a processing stage similar to that of FIG. 7. In referring to construction 200, similar numbering will be utilized as was used above in describing FIGS. 1-13, where appropriate. Construction 200 comprises block 104 formed over a substrate, and comprises layers 106, 108 and 100 over regions 105 of the substrate proximate to block 104. Additionally, construction 200 comprises channel regions 112 extending beneath layer 110.

A first material 202 is formed over layer 110 and within channel regions 112 to partially fill the channel regions, and subsequently a second layer 120 is formed within the partially-filled channel regions 112. Layer 120 can comprise identical materials to those discussed above regarding FIG. 8, and accordingly can comprise soft magnetic materials. Layer 202 can comprise, for example, various electrical insulative materials, including, for example, silicon nitride and silicon dioxide. Material 202 can be utilized to electrically insulate material 120 from layer 108 in applications in which layer 108 comprises an electrically conductive material. For instance, it can be advantageous to utilize a metal as layer 108, and to utilize electrically insulative materials (such as silicon dioxide or silicon nitride) as layers 106 and 110 to enable layer 108 to be selectively removed relative to layers 106 and 110 during formation of channel regions 112. In such applications, insulative material 202 can be utilized to prevent electrical connection between an electrically conductive material 120 and the electrically conductive material 108.

FIG. 15 shows construction 200 after exposure of layers 120 and 202 to planarization (such as, for example, chemical-mechanical polishing) to remove the layers from over block 104 and material 110. Further processing analogous to that of FIGS. 12 and 13 can be utilized to incorporate the structure of FIG. 15 into an MRAM construction. If the structure of FIG. 15 is subjected to processing analogous to that of FIG. 13, a conductive line 24 (shown in FIG. 13) can be formed over block 104 and in electrical connection with material 120. In such applications, electrical isolation of material 120 from other conductive structures with electrically insulative material 202 can be advantageous.

Figure 16:
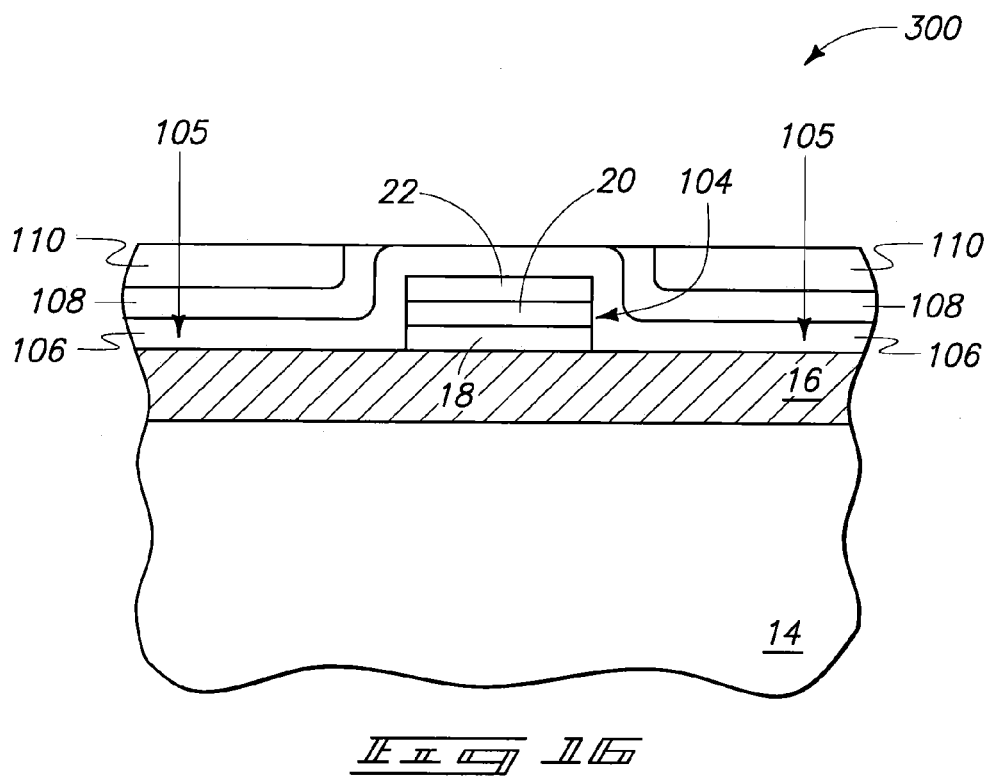
FIG. 16 is a view of the FIG. 3 fragment shown at a processing stage subsequent to that of FIG. 5, in accordance with yet another aspect of the invention.

Another aspect of the invention is described with reference to FIGS. 16 and 17. Similar numbering will be utilized in describing FIGS. 16 and 17 as was used above in describing FIGS. 1-12, where appropriate. Referring initially to FIG. 16, a construction 300 is illustrated at a processing step subsequent to that of FIG. 5. Specifically, the construction of FIG. 5 has been subjected to planarization which removes layers 108 and 110 from over block 104, while leaving layer 106 over block 104.

Figure 17:
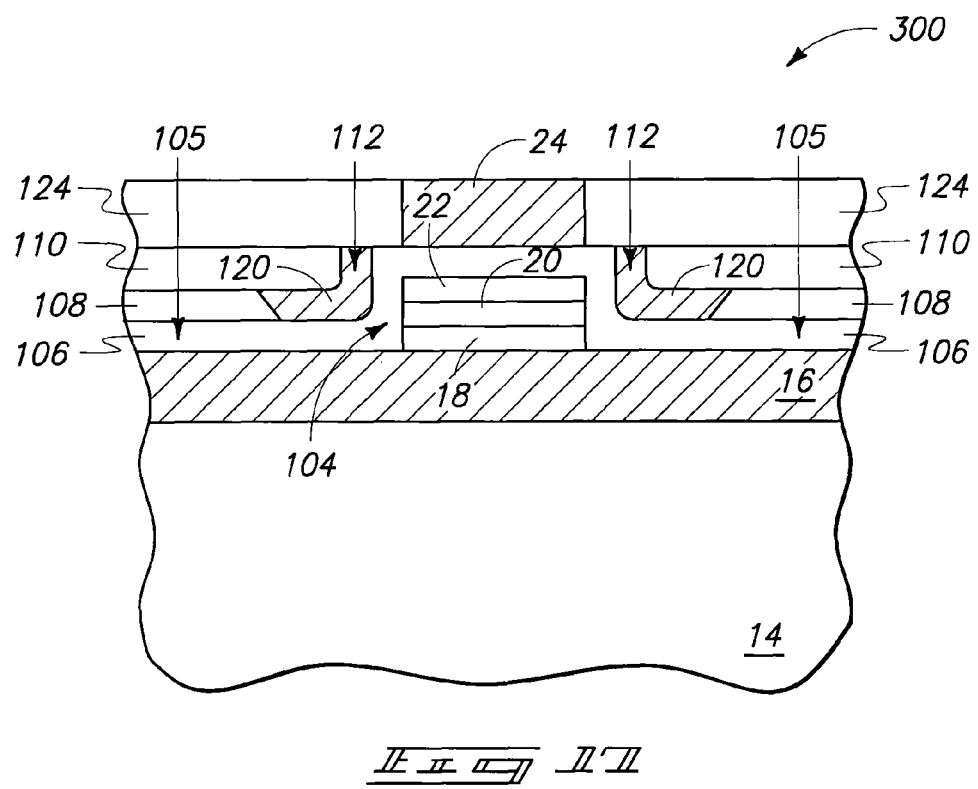
FIG. 17 is a view of the FIG. 16 fragment shown at a processing stage subsequent to that of FIG. 16.

FIG. 17 illustrates construction 300 after further processing to form channel regions 112, magnetic material 120 within the channel regions, a conductive line 24 over block 104, and insulative material 124 along conductive line 24. The processing utilized to take construction 300 from the stage of FIG. 16 to that of FIG. 17 can be analogous to the processing described above with reference to FIGS. 7-12. Construction 300 has conductive line 24 separated from an MRAM bit (comprised by block 104) by insulative material 106. If sufficient current is passed through conductive line 24, the conductive line can generate a magnetic field which interacts with the memory bit during reading and/or writing operations.

Figure 18:
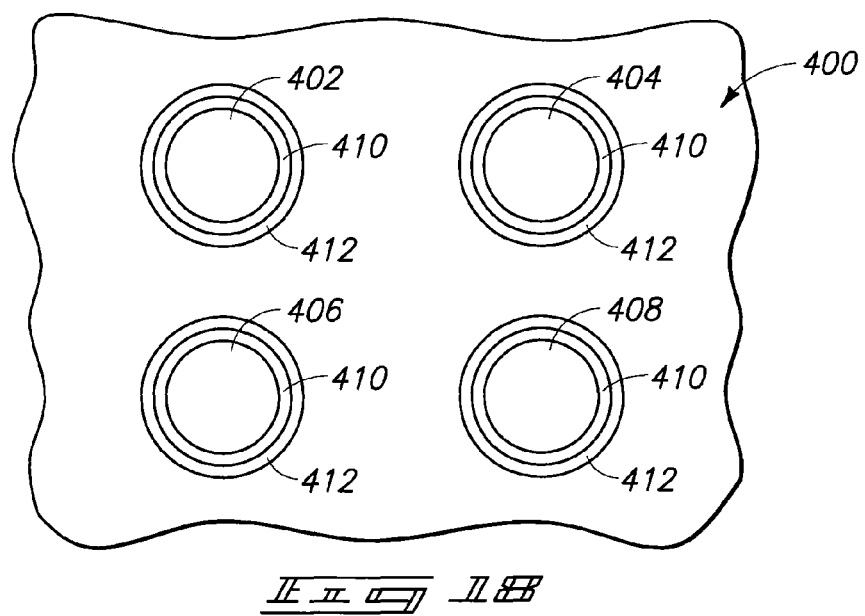
FIG. 18 is a view of an MRAM array formed in accordance with an aspect of the present invention.

FIG. 18 illustrates a diagrammatic view of an MRAM array 400 formed in accordance with various aspects of the present invention. Array 400 comprises a plurality of memory bits 402, 404, 406 and 408. The memory bits can correspond to, for example, the blocks 104 described above with reference to FIGS. 3-17. Each of the memory bits is laterally surrounded by an insulative material 410, and a magnetic shield 412. Insulative material 410 can correspond to, for example, the layers 106 described above with reference to FIGS. 3-17, and the magnetic shield 412 can correspond to the material 120 of, for example, FIG. 10, 12, 13 or 17. Magnetic material 412 forms individual shields laterally around each of the memory bits, which can prevent magnetic cross-talk between adjacent memory bits.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. An assembly, comprising:
   a magnetic memory element; the magnetic memory element comprising three layers; the three layers being a first layer corresponding to a magnetic material, a second layer corresponding to a non-magnetic material, and a third layer corresponding to another magnetic material; the magnetic memory element having a vertical sidewall that extends along the first, second and third layers; the first, second and third layers being coplanar along said vertical sidewall; the vertical sidewall extending entirely around the magnetic memory element, and thus defining a lateral periphery of the magnetic memory element; and
   a magnetic barrier material laterally offset from lateral periphery of the magnetic memory element and vertically overlapping two of the three layers of the magnetic memory element.

2. The assembly of claim 1 wherein the at least one of the first and third layers comprises a soft magnetic material.

3. The assembly of claim 1 wherein the first and third layers comprise soft magnetic materials.

4. The assembly of claim 1 wherein the magnetic barrier material is laterally offset from the lateral periphery of the magnetic memory element by at least one electrically insulative material.

5. An assembly, comprising:
   a magnetic memory element; the magnetic memory element comprising a vertical stack of three structures; the three structures being a first structure corresponding to a magnetic substance, a second structure corresponding to a non-magnetic substance, and a third structure corresponding to another magnetic substance; the magnetic memory element having a vertical sidewall along the first, second and third structures; the first, second and third structures being coplanar along said vertical sidewall; and
   a magnetic shield extending along the magnetic memory element; the magnetic shield vertically overlapping two of the three structures of the magnetic memory element.

6. The assembly of claim 5 wherein the at least one of the first and third structures corresponds to a soft magnetic substance.

7. An assembly, comprising:
   a magnetic memory element;
   a first layer, a second layer, and a third layer proximate the magnetic memory element, the second layer being recessed relative to the first and third layers to define a channel that extends around the periphery of the magnetic memory element; wherein the second layer comprises silicon dioxide; wherein the first and third layers comprise silicon nitride or silicon carbide; and
   a magnetic barrier material extending substantially around a periphery of the magnetic memory element, the magnetic barrier material extending within said channel.

8. The assembly of claim 7 wherein the third layer comprises silicon nitride.

9. The assembly of claim 7 wherein the first and third layers comprise silicon nitride.

10. The assembly of claim 7 wherein the first and third layers comprise silicon carbide.

11. An assembly, comprising:
    a magnetic memory element;
    a first layer, a second layer, and a third layer proximate the magnetic memory element, the second layer being recessed relative to the first and third layers to define a channel that extends around the periphery of the magnetic memory element; wherein the first and third layers comprise silicon carbide; wherein the second layer does not comprise silicon carbide; and
    a magnetic barrier material extending substantially around a periphery of the magnetic memory element, the magnetic barrier material extending within said channel.

12. An assembly, comprising:
    a magnetic memory element laterally surrounded by one or more materials; wherein the one or more materials include a first, second and third layer; wherein the second layer comprises silicon dioxide; and wherein the first and third layers comprise silicon nitride or silicon carbide;
    a channel within the one or more materials and laterally surrounding the magnetic memory element, the second layer being recessed relative to the first and third layers to define the channel; and
    a magnetic shield extending within the channel and laterally surrounding the magnetic memory element.

13. The assembly of claim 12 wherein the third layer comprises silicon nitride.

14. The assembly of claim 12 wherein the first and third layers comprise silicon nitride.

15. The assembly of claim 12 wherein the first and third layers comprise silicon carbide.

16. An assembly, comprising:
    a magnetic memory element laterally surrounded by one or more materials; wherein the one or more materials include a first, second and third layer; wherein the second layer does not comprise silicon carbide; and wherein the first and third layers comprise silicon carbide;
    a channel within the one or more materials and laterally surrounding the magnetic memory element, the second layer being recessed relative to the first and third layers to define the channel; and
    a magnetic shield extending within the channel and laterally surrounding the magnetic memory element.

* * * * *